US012763680B2

(12) United States Patent
Zlotnik et al.

(10) Patent No.: US 12,763,680 B2
(45) Date of Patent: Oct. 13, 2026

(54) VOLTAGE DOMAIN BASED ERROR MANAGEMENT

(71) Applicant: Micron Technology, Inc., Boise, ID (US)

(72) Inventors: Leon Zlotnik, Camino, CA (US); Leonid Minz, Beer Sheva (IL)

(73) Assignee: Micron Technology, Inc., Boise, ID (US)

( * ) Notice: Subject to any disclaimer, the term of this patent is extended or adjusted under 35 U.S.C. 154(b) by 105 days.

(21) Appl. No.: 18/602,819

(22) Filed: Mar. 12, 2024

(65) Prior Publication Data

US 2024/0322675 A1 Sep. 26, 2024

Related U.S. Application Data

(60) Provisional application No. 63/453,272, filed on Mar. 20, 2023.

(51) Int. Cl.
*H02M 3/04* (2006.01)
*H03K 3/037* (2006.01)

(52) U.S. Cl.
CPC .............. *H02M 3/04* (2013.01); *H03K 3/037* (2013.01)

(58) Field of Classification Search
None
See application file for complete search history.

(56) References Cited

U.S. PATENT DOCUMENTS

| | | | | |
|---|---|---|---|---|
| 8,972,755 B1 * | 3/2015 | Hasko | H02M 3/156 323/224 |
| 9,575,882 B2 | 2/2017 | Nellans et al. | |
| 9,786,356 B2 * | 10/2017 | Wang | G11C 29/021 |
| 10,824,499 B2 | 11/2020 | Hu et al. | |
| 2013/0003442 A1 * | 1/2013 | Asthana | G11C 11/417 365/230.01 |
| 2015/0177751 A1 * | 6/2015 | Valka | G05F 1/10 327/540 |
| 2017/0054300 A1 * | 2/2017 | Shao | G11C 17/16 |
| 2019/0187690 A1 | 6/2019 | Cella et al. | |
| 2024/0321380 A1 * | 9/2024 | Zlotnik | H03K 3/037 |

FOREIGN PATENT DOCUMENTS

| | | | |
|---|---|---|---|
| CN | 114036895 A * | 2/2022 | G06F 30/398 |
| WO | WO-0171884 A2 * | 9/2001 | G06F 1/3203 |
| WO | WO-2023221330 A1 * | 11/2023 | H05B 45/375 |

OTHER PUBLICATIONS

Razor: Circuit-Level Correction Oftiming Errors Forlow-Power Operation, IEEE (Year: 2004).*

* cited by examiner

*Primary Examiner* — Guerrier Merant
(74) *Attorney, Agent, or Firm* — Brooks, Cameron & Huebsch, PLLC

(57) ABSTRACT

A method includes supplying, via a first voltage regulator, a first supply voltage to a first voltage domain including circuitry configured to operate at the first supply voltage, supplying, via a second voltage regulator, a second supply voltage to a second voltage domain including circuitry configured to operate in a voltage zone, detecting a change in an error characteristic of data associated with the second voltage domain, and altering the second supply voltage to an altered supply voltage based on the change in the error characteristic.

18 Claims, 6 Drawing Sheets

VOLTAGE DOMAIN BASED ERROR MANAGEMENT

PRIORITY INFORMATION

This Application claims the benefits of U.S. Provisional Application No. 63/453,272, filed on Mar. 20, 2023, the contents of which are incorporated herein by reference.

TECHNICAL FIELD

Embodiments of the disclosure relate generally to digital logic circuits and memory devices, and more specifically, relate to voltage domain based error management.

BACKGROUND

Various types of electronic devices such as digital logic circuits and memory systems may store and process data. A digital logic circuit is an electronic circuit that processes digital signals or binary information, which can take on two possible values (usually represented as 0 and 1). The digital logic circuit can use logic gates to manipulate and transform the digital signals or binary information. Digital logic circuits can be, for example, used in a wide range of electronic devices including computers, calculators, digital clocks, and many other electronic devices that employ digital processing. Digital logic circuits can be designed to perform specific logical operations on digital inputs to generate digital outputs, and, in some instances, can be combined to form more complex circuits to perform more complex operations. A memory device can include one or more memory devices that store data. The memory devices can be, for example, non-volatile memory devices and volatile memory devices. In general, a host system can utilize a memory system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
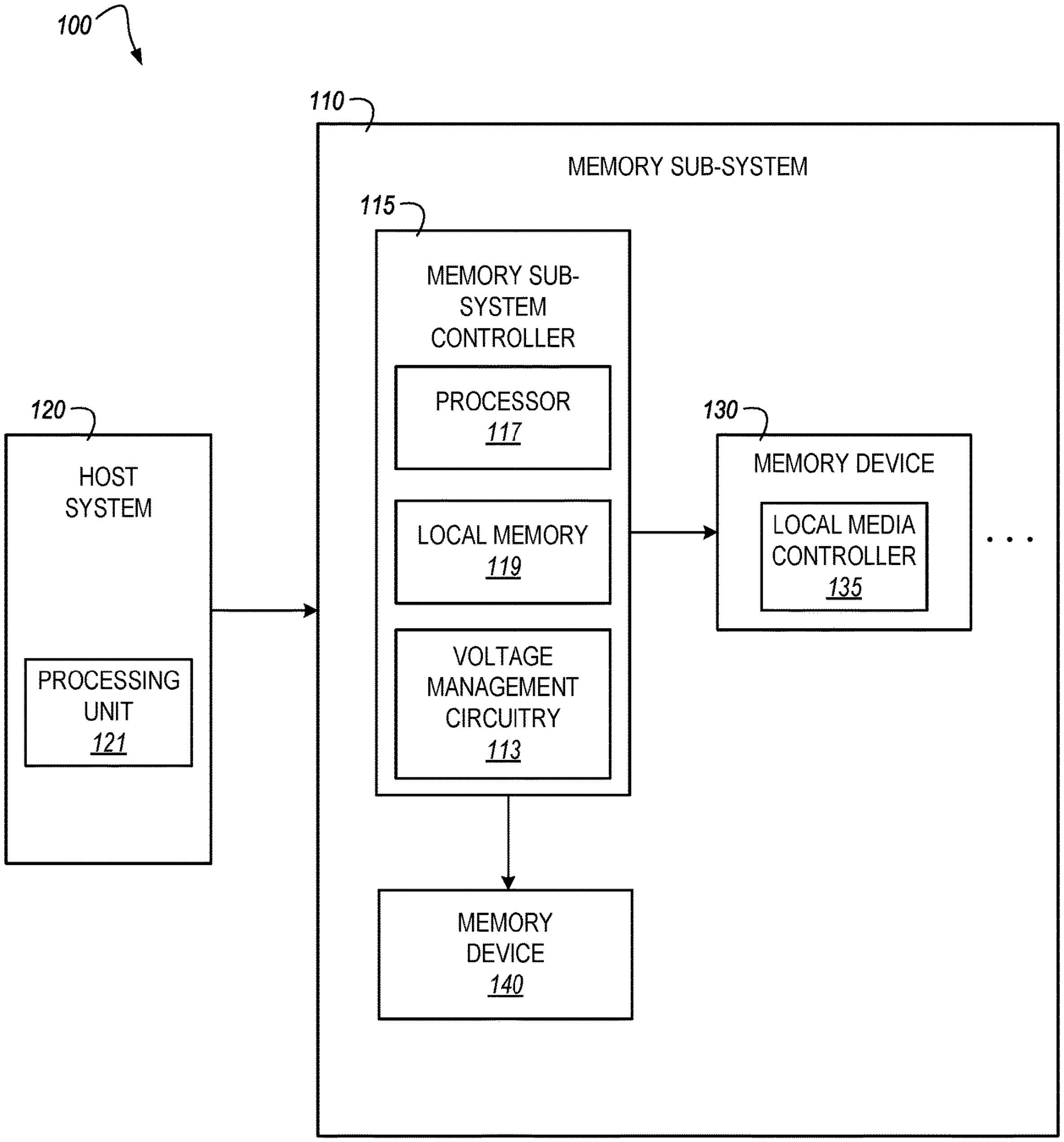
FIG. 1 illustrates an example memory system configured in accordance with some embodiments of the present disclosure.

Aspects of the present disclosure are directed to voltage domain based error management and, in particular to memory systems (e.g., memory sub-systems) that include voltage management circuitry, a first voltage regulator associated with a first voltage domain, and a second voltage regulator associated with a second voltage domain, as described herein. The voltage management circuitry may also be referred to as "voltage regulator based error management circuitry" herein.

Electronic devices may include a control path and a data path. The control path generally handles command processing, address translation, data path management, and/or media command interface, among other control operations. For instance, the control path may include control logic (e.g., a finite-state machine, etc.) and/or other circuitry configured to perform control operations such as those described above. The data path generally handles data such as data which is configured to be communicated in accordance with various wired protocols and/or various wireless protocols.

The control path and the data path may have different error tolerances. A used herein an error tolerance refers to a quantity of errors such as a quantity of errors over a period of time at which an apparatus may function as intended. For instance, the data path may be relatively error tolerant. For example, the data path may include various error correction mechanisms (e.g., ECC, LDPC, FEC, etc.) configured to detect and correct errors up to a relatively high error rate (e.g., a bit error rate (BER)<1E-3, <1E-4, <1E-5, <1E-6, or <1E-10, etc.). However, the control path may be less tolerant of errors than the data path and/or may be required to operate in a substantially error-free manner. For example, to ensure that the electronic device functions as intended the control path may be configured to operate in a substantially error-free manner (e.g., having a BER<1E-16, or <1E-17, etc.). That is, the error tolerance of the control path may be many orders of magnitude less than the error tolerance of the data path.

To ensure that the control path operates in the substantially error-free manner, some previous approaches may constrain both the control path and the data path to operate at the same relatively low error rate (e.g., a BER<1E-17). Such approaches may configure a voltage regulator to supply the same relatively high supply voltage to both the control path and the data path. Therefore, such approaches may ensure that circuitry in the control path operates in a substantially error-free manner (e.g., having a BER<1E-17) at least due to being supplied with the relatively high supply voltage.

However, such approaches thereby over-constrain the data path by many orders of magnitude (e.g., by fourteen orders of magnitude). A resultant error rate (a BER<1E-17) of the data associated with the data path may be significantly lower than a permissible error rate (e.g., a BER<1E-3) at which the data path could otherwise be satisfactorily operated. Stated differently, the reduction in errors realized by over-constraining the data path may yield no discernable difference in the actual performance of the electronic device (e.g., as the error correction mechanisms are configured to detect and correct a substantially higher quantity of errors).

Yet, the reduction in errors in the data associated with the data path comes at a substantial cost in terms of the amount of power consumed by the electronic device. That is, the amount of power consumed by the data path may far exceed an amount of power associated with operating the data path at or closer to a permissible error rate (e.g., a BER<1E-3). Moreover, in view of the above-mentioned reduction in a quantity of errors, such approaches may retain a large overhead (e.g., in terms of physical space occupied, power consumed by, and/or various error bits, etc.) associated with the underutilized error correction circuitry and/or underutilized error detection circuitry. Additionally, operation of the data path at the high supply voltage may subject components (e.g., logic gates, transistors, etc.) in the data path to higher than necessary voltage levels which may damage or reduce an operation lifetime of the components. Further, as electronic devices evolve a degree of error tolerance of a control path in the electronic devices may decrease and thereby exacerbate the above issues.

To address the above and other deficiencies, approaches herein employ voltage management circuitry configured to supply, via a first voltage regulator, a first supply voltage to a first voltage domain including circuitry (e.g., control path circuitry), supply, via a second voltage regulator, a second supply voltage to a second voltage domain including circuitry (e.g., data path circuitry), detect a change in an error characteristic (e.g., a BER) of data associated with the second voltage domain, and alter the second supply voltage to an altered supply voltage based on the change in the error characteristic, as described herein.

For instance, approaches herein may supply the first voltage domain with a voltage that is substantially equal to a nominal voltage of a voltage regulator to ensure that the first voltage domain operates in a substantially error-free manner. Yet, approaches herein may supply the second voltage domain with a supply voltage that is less than a nominal voltage of a voltage regulator. For instance, the second voltage domain may be supplied with a supply voltage that is within a voltage zone (e.g., a virtual tolerant voltage zone) including at least some values that are less than the nominal voltage of a voltage regulator. In this way, an amount of power consumed by the data path in the second voltage domain may be reduced, as compared to other approaches such as those that supply both the data path and the control path with the same relatively high supply voltage.

Additionally, as mentioned the second supply voltage may be altered to the altered supply voltage based on the error characteristic of data associated with the second voltage domain, as described herein. For example, embodiments herein may ensure that the data path in the second voltage domain operates within the voltage zone at a permissible error rate. For instance, a value of the altered supply voltage supplied by the second voltage regulator may be negatively correlated to a value of the error characteristic of data associated with the second voltage domain. As used herein, being "negatively correlated" refers to a relationship between two variables such that as one variable increases, the other variable tends to decrease, and vice versa. In other words, there is an inverse relationship between the two variables.

As such, a decrease in the error characteristic (e.g., a decrease in BER) can result from (e.g., can cause) an increase in the supply voltage (e.g., a value of the altered supply voltage may be higher than a value of the second supply voltage). That is, the decrease in the supply voltage may result in a subsequent increase in the error characteristic such as an increase of an error rate. Conversely, an increase in the error characteristic (e.g., an increase in the BER) can result from a decrease in the supply voltage (e.g., a value of the altered supply voltage can be less than a value of the second supply voltage). That is, the increase in the supply voltage may result in a subsequent decrease in the error characteristic such as a decrease of an error rate. As such, a value of the voltage supplied by the second voltage regulator may be tailored to maintain the error characteristic of the data within a permissible error range and yet reduce to the extent possible an amount of power consumed by the second voltage domain.

As used herein, a voltage domain refers to a device or a portion of a device configured to operate at a given voltage (e.g., a given supply voltage). Each voltage domain may have a different set of power bonding pads (e.g., a power pin) and ground bonding pads (e.g., a ground pin) coupled to a voltage rail. A voltage regulator can supply the voltage domains with a given voltage and/or range of voltages. For example, the first voltage domain may include circuitry that is configured to operate at a first supply voltage supplied via a first voltage regulator while other circuitry in the second voltage domain may be configured to operate at a second supply voltage (that is different than the first supply voltage) supplied by a second voltage regulator, as described herein.

In the interest of clarity, embodiments herein will be generally described in relation to electronic devices/circuitry having a given quantity of voltage domains (e.g., two voltage domains), it will be appreciated that embodiments in which a different quantity of voltage domains are contemplated within the scope of the disclosure. In the interest of clarity, embodiments herein will be generally described in relation to a memory device, however, it will be appreciated that embodiments in which other circuitry such as a digital logic circuit, latches, various I/O circuitry, a cache, etc. is utilized are contemplated within the scope of the disclosure.

In some embodiments, the voltage domains can be included in one or more memory resources that are associated with the memory system. A memory system (e.g., memory sub-system) can be a storage system, storage device, a memory module, or a combination of such. An example of a memory sub-system is a storage system such as a solid-state drive (SSD). Examples of storage devices and memory modules are described below in conjunction with FIG. 1, et alibi.

In general, a host system can utilize a memory sub-system that includes one or more components, such as memory devices that store data. The host system can provide data to be stored at the memory sub-system and can request data to be retrieved from the memory sub-system. For instance, during operation of a computing system, data may be written to, and retrieved from the memory sub-system. Some data may be written to persistent memory devices (which can be analogous to or similar to "non-volatile memory" devices) within the memory sub-system for long-term storage, while other data may be written to non-persistent memory devices (which can be analogous to or similar to "volatile" memory devices) within the memory sub-system for quick, short-term retrieval. Still other data may be written to various memory resources and/or caches of the memory sub-system to assist with performance of operations involving the memory sub-system.

For example, various memory resources and/or caches can be utilized during operation of the memory sub-system to provide read caching, write-through caching, write-back caching, and/or write-around caching. In addition, some memory resources and/or caches of the memory sub-system can be allocated to store various tables that are utilized during operation of the memory sub-system. One such example is a logical-to-physical (L2P) table that is used to map logical addresses utilized by a host system to physical addresses of the memory sub-system where data is physically stored. Another such example is a database containing an organized collection of data that is stored within the memory resource and/or cache.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

In other embodiments, the voltage management circuitry 113 can be deployed on, or otherwise included in a computing device such as a desktop computer, laptop computer, server, network server, mobile computing device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 includes a processing unit 121. The processing unit 121 can be a central processing unit (CPU) that is configured to execute an operating system. In some embodiments, the processing unit 121 comprises a complex instruction set computer architecture, such an x86 or other architecture suitable for use as a CPU for a host system 120.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via the same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include voltage management circuitry 113. Although not shown in FIG. 1 so as to not obfuscate the drawings, the voltage management circuitry 113 can include various circuitry to facilitate aspects of the disclosure described herein. In some embodiments, the voltage management circuitry 113 can include special purpose circuitry in the form of an ASIC, FPGA, state machine, hardware processing device, and/or other logic circuitry that can allow the voltage management circuitry 113 to orchestrate and/or perform operations to provide voltage regulator based error management, particularly with respect to a system-on-chip, in accordance with the disclosure.

In some embodiments, the memory sub-system controller 115 includes at least a portion of the voltage management circuitry 113. For example, the memory sub-system controller 115 can include a processor 117 (processing device) configured to execute instructions stored in local memory 119 for performing the operations described herein. In some embodiments, the voltage management circuitry 113 is part of the host system 110, an application, or an operating system. The voltage management circuitry 113 can be resident on the memory sub-system 110 and/or the memory sub-system controller 115. As used herein, the term "resident on" refers to something that is physically located on a particular component. For example, the voltage management circuitry 113 being "resident on" the memory sub-system 110, for example, refers to a condition in which the hardware circuitry that comprises the voltage management circuitry 113 is physically located on the memory sub-system 110. The term "resident on" may be used interchangeably with other terms such as "deployed on" or "located on," herein.

Figure 2A:
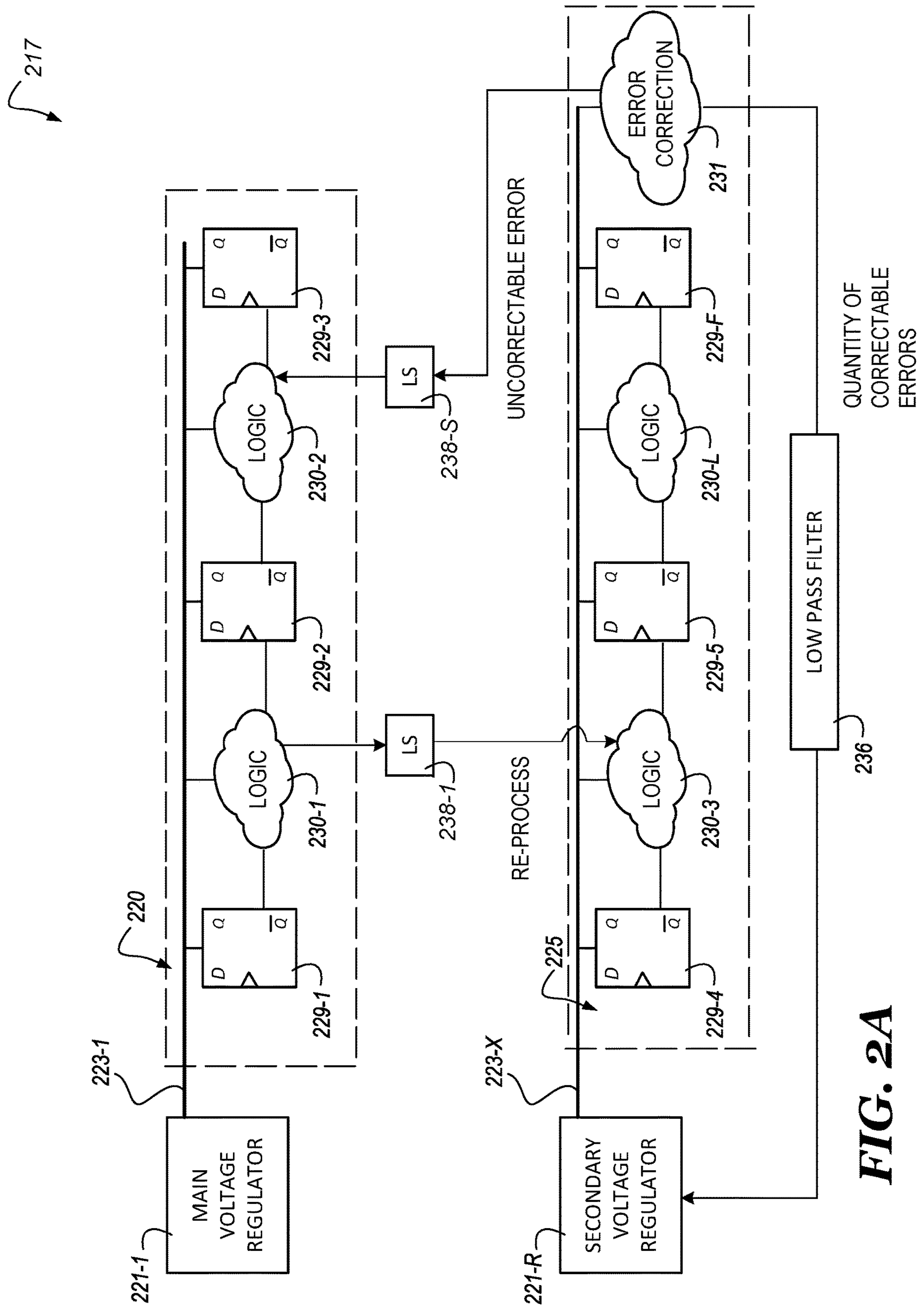
FIG. 2A illustrates an example diagram of an apparatus suitable for voltage domain based error management in accordance with some embodiments of the present disclosure.
Figure 2B:
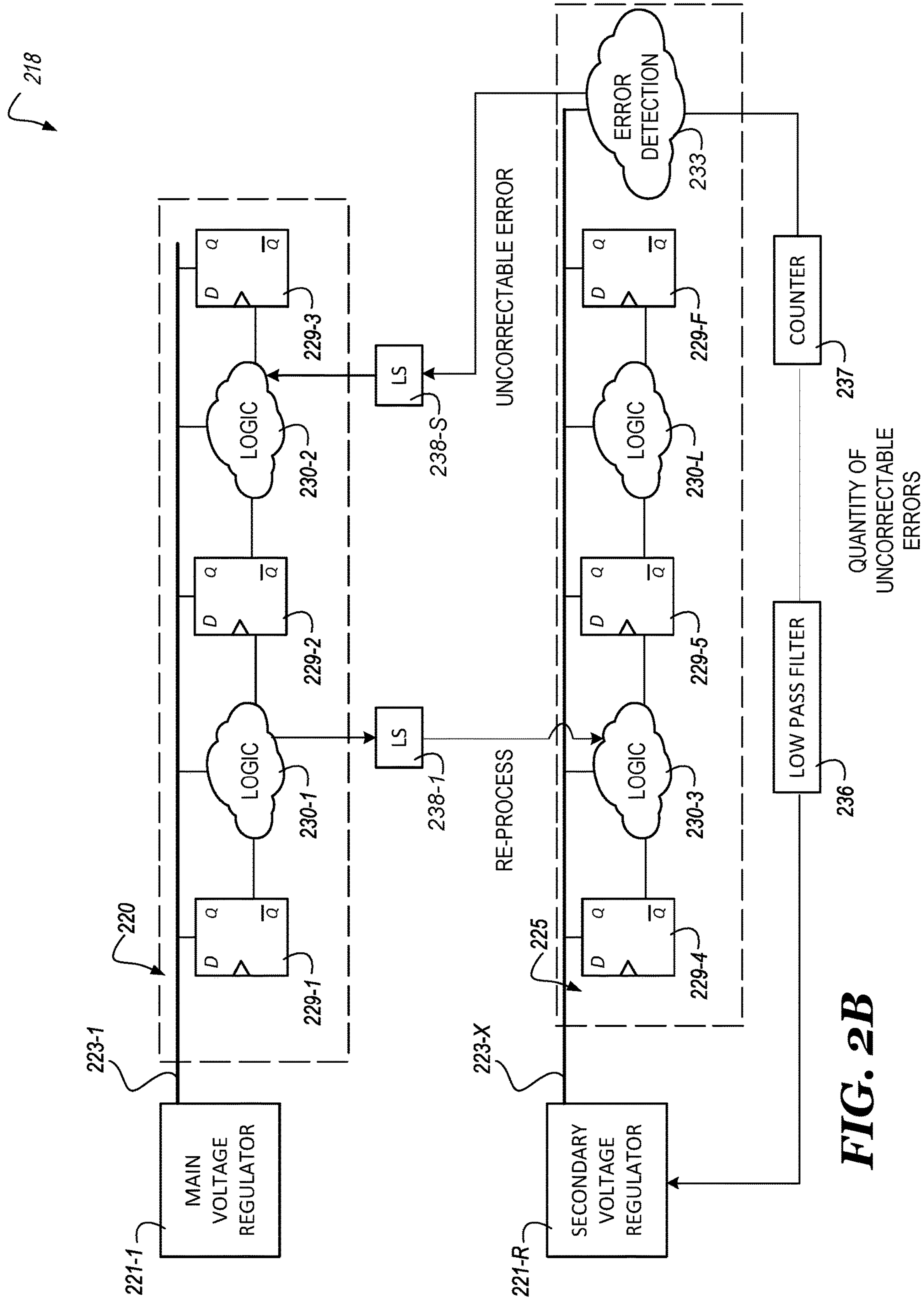
FIG. 2B illustrates an example diagram of another apparatus suitable for voltage domain based error management in accordance with some embodiments of the present disclosure.

FIG. 2A illustrates an example diagram of an apparatus 217 suitable for voltage domain based error management in accordance with some embodiments of the present disclosure. FIG. 2B illustrates an example diagram of another apparatus 218 suitable for voltage domain based error management in accordance with some embodiments of the present disclosure. The elements in FIG. 2B can be analogous to the elements of FIG. 2A, with the distinction that FIG. 2B includes a counter and further includes error detection circuitry instead of the error detection and error correction circuitry included in FIG. 2A.

As illustrated in FIG. 2A and FIG. 2B, each of the apparatus 217 and the apparatus 218 includes a plurality of different voltage domains (e.g., two different power domains) represented as a first voltage domain 220 and a second voltage domain 225. Each voltage domain can include respective circuitry. For instance, the first voltage domain 220 may include control path circuitry and the second voltage domain 225 may include data path circuitry. The control path circuitry may be configured to form a control path which operates at a first supply voltage and the data path circuitry may be configured to form a data path which operates in a voltage zone defined by an upper voltage and a lower voltage, as described herein.

The control path circuitry may include flip-flop (FF) circuits such as a first flip-flip (FF) circuit 229-1, a second FF circuit 229-2, and a third FF circuit 229-3 and logic such as a first logic circuit 230-1 and a second logic circuit 230-2. Similarly, the data path circuitry may include FF circuits such as a fourth FF circuit 229-4, a fifth FF circuit 229-5, and a sixth FF circuit 229-F and logic such as a third logic circuit 230-3 and a fourth logic circuit 230-L. FF circuits (e.g., FF) refer to a general-purpose data storage element that may be used in digital electronic circuitry. FF circuits may be general-purpose clocked storage elements that make sequential and state logic design feasible. FF circuits may store logic states, parameters, and/or digital control signals, etc. Examples of suitable types of flip-flop circuits include D, set, reset, set-reset, JK, toggle enable, and/or scan type FF circuits. The logic circuits can include various logical circuitry such as various types of logical gates configured to perform aspects herein. While FIG. 2A and FIG. 2B illustrate FF and logic circuits, the one or more of the voltage domains may include alternate and/or additional components such as latches, I/O, caches, memory, etc.

Each voltage domain may be coupled to a respective voltage rail. Having each of the voltage domains coupled via a respective voltage rail to a corresponding voltage regulator may promote aspects herein. For instance, a first voltage regulator 221-1 may be coupled to a first voltage rail 223-1 in the first voltage domain 220 and a second voltage regulator 221-R may be coupled to a second voltage rail 223-X in the second voltage domain 225. In some embodiments, a controller (e.g., the controller 115 described with respect to FIG. 1) may cause a first voltage regulator 221-1 to supply the first supply voltage via the first voltage rail 223-1 to the first voltage domain 220 and may cause the second voltage regulator 221-R to supply the second supply voltage via the second voltage rail 223-X to the second voltage domain 225.

In some embodiments, the controller may cause the second voltage regulator 221-R to supply an altered supply voltage to the second voltage domain 225. For instance, the controller may cause the second voltage regulator 221-R to supply an altered supply voltage to the second voltage domain 225 responsive to a change in an error characteristic of data associated with the second voltage domain 225.

As illustrated in FIG. 2A, the apparatus 217 may include error detection and correction circuitry 231 (hereinafter referred to as error correction circuitry 231). Thus, in some embodiments, the apparatus 217 may be configured to detect and correct, via the error correction circuitry 231, a quantity of errors (e.g., correctable errors) in data associated with the second voltage domain 225. For instance, the error correction circuitry 231 may correct a quantity of correctable errors and may subsequently transmit signaling indicative of the quantity of correctable error to a controller and/or a voltage regulator such as the second voltage regulator 221-R.

In some embodiments, a low-pass filter 236 may be configured to receive the signaling indicative of a quantity of correctable errors transmitted by the error correction circuitry 231, as illustrated in FIG. 2A. The low-pass filter 236 may be configured to attenuate (e.g., not transmit or transmit a reduced quantity of errors that is equal to or less than a correctable error threshold) the quantity of correctable errors when the quantity of correctable errors exceeds a correctable error threshold. The correctable error threshold may be a particular value, rate, and/or rate of change in a quantity of errors. Additionally, the low-pass filter 236 may transmit to the controller and/or voltage regulator signaling that is indicative of the quantity of correctable errors when the quantity of correctable errors is less than or equal to the correctable error threshold. In this way, the low-pass filter may mitigate any abrupt change (e.g., an abrupt change in the value of the altered supply voltage) in the supply voltage supplied by the second voltage regulator 221-R, for instance, when a large quantity of errors is received, and yet may transmit the quantity of errors (when the quantity of errors is less than the error threshold) to permit alteration of the voltage supplied to the second voltage domain 225 based on a change in an error characteristic of the data associated with the second voltage domain 225.

In some embodiments, the error correction circuitry 231 may be configured to cause uncorrectable errors (e.g., errors with a magnitude and/or a type of error that is outside of the error correction capabilities of the error correction circuitry 231) to be reprocessed. For instance, the error correction circuitry 231 may detect an uncorrectable error in data associated with the second voltage domain 225. In some embodiments, at least one level shifter may couple the first voltage domain 220 to the second voltage domain 225. For instance, a first level shifter 238-1 and a second level shifter 238-S may couple the first voltage domain 220 to the second voltage domain 225, as illustrated in FIG. 2A and FIG. 2B. In such embodiments, responsive to detection of the uncorrectable error, the error correction circuitry 231 may transmit signaling via the second level shifter 238-S indicative of the uncorrectable error and/or an operation which lead to the uncorrectable error, etc. The logic in the first voltage domain 220 can cause the data having the uncorrectable error to be reprocessed ("RE-PROCESS") and to be communicated, via a first level shifter 238-1 to the second voltage domain 225.

Similarly, the apparatus 218 may include error detection circuitry 233, as illustrated in FIG. 2B. The error detection circuitry 233 may be configured to detect but not correct errors. Embodiments employing only error detection circuitry 233 (in the absence of error correction circuitry), as illustrated in FIG. 2B, may yield a further reduction in an amount of power consumed by the second voltage domain 225 as compared to approaches that employ error correction. That is, for at least some types of data reprocessing of the data responsive to detection of an error may utilize less power and/or have less computation overhead than performance of error correction.

As such, responsive to detection of an error (e.g., an uncorrectable error) the error detection circuitry 233 may transmit signaling via the second level shifter 238-S indicative of the uncorrectable error and/or an operation which lead to the uncorrectable error, etc. The logic in the first voltage domain 220 can cause the data having the uncorrectable error to be reprocessed and to be communicated, via the first level shifter 238-1 to the second voltage domain 225. The error detection circuitry 233 may transmit signaling indicative of the quantity of uncorrectable error detected to a counter 237. The counter may count the quantity of uncorrectable errors. For instance, the counter 237 may be incremented for each error, among other possibilities.

The counter 237 may transmit signaling indicative of the quantity of errors counted by the counter 237 to a low pass filter 236. The low-pass filter 236 may attenuate (e.g., not transmit or transmit a reduced quantity of errors that is equal to or less than an uncorrectable error threshold) the quantity of uncorrectable errors when the quantity of uncorrectable errors exceeds an uncorrectable error threshold. The uncorrectable error threshold may be a particular value, rate, and/or rate of change in a quantity of errors. Additionally, the low-pass filter 236 may transmit to the controller and/or voltage regulator signaling that is indicative of the quantity of uncorrectable errors when the quantity of uncorrectable errors is less than or equal to the uncorrectable error threshold. In this way, the low-pass filter may mitigate any abrupt change (e.g., an abrupt change in the value of the altered supply voltage) in the supply voltage supplied by the second voltage regulator 221-R, for instance, when a large quantity of errors is received.

In some embodiments, the controller may receive signaling indicative of a quantity of errors in data associated with the second voltage domain 225. The quantity of errors may include a quantity of uncorrectable errors and/or a quantity of correctable errors. For instance, the apparatus 217 may transmit signaling indicative of a quantity of correctable errors, as illustrated in FIG. 2A, while the apparatus 218 may transmit signaling indicative of a quantity of uncorrectable errors, as illustrated in FIG. 2B, among other possibilities.

In some embodiments, the controller may determine, based on the signaling indicative of the quantity of errors, an error characteristic such as a BER of the data associated with the second voltage domain 225. In some embodiments, the controller may be configured to cause the second voltage regulator 221-R to alter, based on a change in the performance characteristic (e.g., BER), the second supply voltage to an altered supply voltage that is supplied to the second voltage domain 225.

As mentioned, the first supply voltage (e.g., supplied by the first "MAIN" voltage regulator 221-1) may be higher than a second supply voltage and an altered supply voltage which are included in the voltage zone and are supplied by the second "SECONDARY" voltage regulator. That is, the second voltage regulator 221-R can supply voltages (e.g., the second supply voltage, the altered supply voltage, etc.) that are less than a nominal voltage of the first regulator and less the nominal voltage of the second regulator to reduce an amount of power consumed by the second voltage domain 225, as described herein. For instance, the first supply voltage may be substantially equal to a nominal voltage (e.g., 0.8 volts) of the first voltage regulator 221-1, while both the second supply voltage and the altered supply voltage may be less than the nominal voltage, as described herein in greater detail with respect to FIG. 3. As used herein, the term "substantially" intends that the characteristic need not be absolute, but is close enough so as to achieve the advantages of the characteristic. For example, a "substantially equal" is not limited to absolute values. For instance, continuing with the above examples a value of the first supply voltage can be within 0.5%, 1%, 2%, or 5%, etc. of the nominal voltage of the first voltage regulator 221-1.

While FIG. 2A and FIG. 2B illustrate particular quantities of FF circuits, logic circuits, voltage domains, and voltage rails, etc., the quantity of quantities of FF circuits, logic circuits, voltage domains, and/or voltage rails, etc. illustrated in FIG. 2A and FIG. 2B may be varied.

Figure 3:
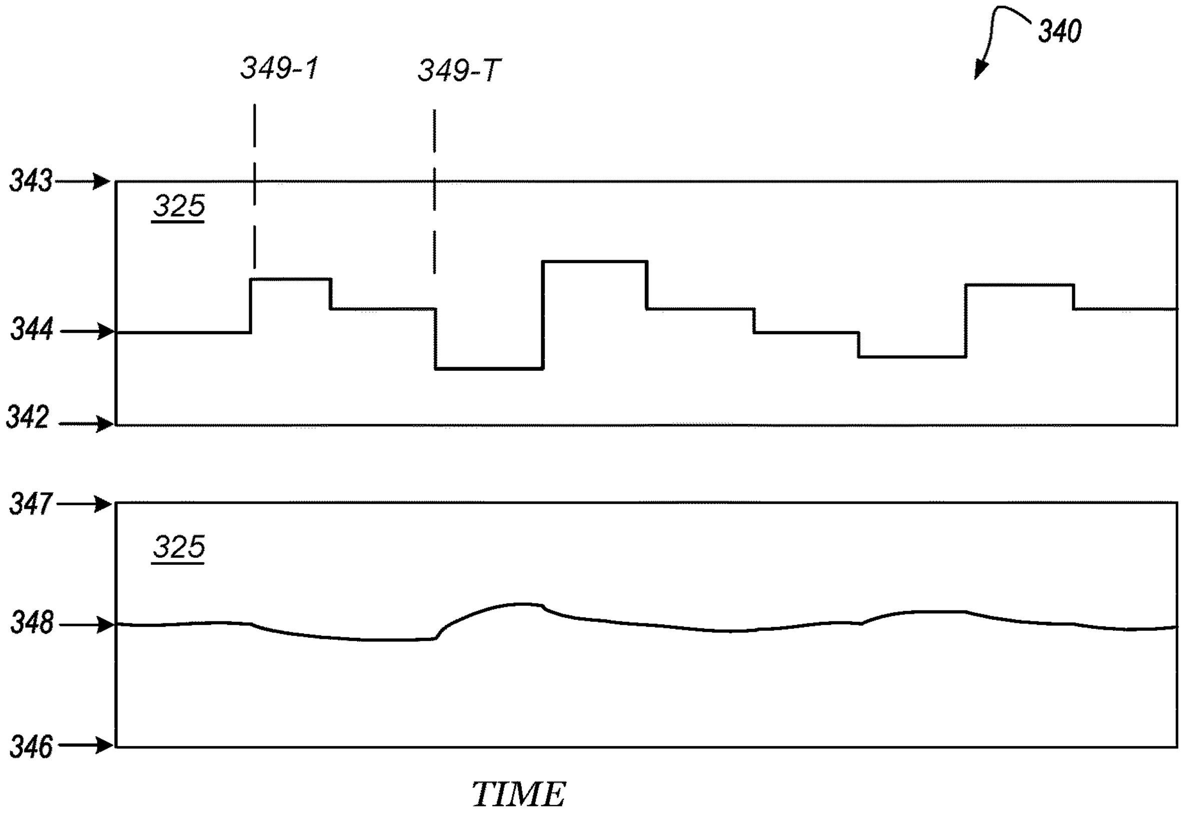
FIG. 3 illustrates a representation of an example diagram illustrating aspects of voltage domain based error management in accordance with some embodiments of the present disclosure.

FIG. 3 illustrates an example diagram 340 illustrating aspects of voltage domain based error management in accordance with some embodiments of the present disclosure. As illustrated in FIG. 3, a value of error characteristic 344 of data associated with a second voltage domain 325 and a value of a supply voltage (represented by 348) supplied to the second voltage domain 325 can vary over time. For instance, the error characteristic 344 may vary based on change in the supply voltage supplied to circuitry (e.g., data path circuitry) and logic in the second voltage domain 325. As such, embodiments herein provide a second supply voltage provided by the second voltage regulator may be altered to an altered supply voltage based on a change in the error characteristic. For example, a decrease in the supply voltage supplied to the second voltage domain 325 may cause an increase in the error characteristic (e.g., an increase in an error rate of the data associated with the second voltage domain). Conversely, an increase in the supply voltage supplied to the second voltage domain 325 may cause a decrease in the error characteristic. That is, the error characteristic may be negatively correlated to the supply voltage.

In some embodiments, a value of the supply voltage supplied by the second voltage regulator may be altered, as described herein, to maintain the error characteristic of the data within a permissible error range and yet reduce to the extent possible an amount of power consumed by the second voltage domain 325. For instance, the supply voltage supplied by the second voltage regulator to the second voltage domain 325 may be altered within a voltage zone extending from an lower voltage 346 to an upper voltage 347. Stated differently, the lower voltage 346 and the upper voltage 347 can define the voltage zone.

The voltage zone may include at least some values that are less than a nominal voltage (e.g., 0.8 volts) of a voltage regulator such as the first voltage regulator and/or the second voltage regulator. For instance, the upper voltage 347 may be equal to a nominal voltage (0.8 volts) of a voltage regulator (e.g., the first voltage regulator, the second voltage regulator, or both). The lower voltage 346 may be equal to a value (e.g., 0.65 volts) that is less than the nominal voltage. In some embodiments, the lower voltage 346 may have a value that is less than the nominal voltage but is still sufficiently high (e.g., 0.65 volts, 0.70 volts, etc.) to ensure that the circuitry in the second voltage domain 325 yields accurate data with a sufficient reliability (e.g., exhibits an error characteristic that is less than an upper error value 343).

In some embodiments, the lower voltage 346, the upper voltage 347, or both, may be variable. For instance, the lower voltage 346 may be varied based on a type of the data associated with the second voltage domain 325, a grade of an apparatus, an operational temperature of the apparatus, an age of the apparatus, a variation in a nominal voltage of the voltage regulator, or any combination thereof. For example, the lower voltage 346 may be decreased when the type of data is data (e.g., WI-FI data, BLUETOOTH data, etc.) communicated in accordance with a wireless protocol and the lower voltage 346 may be increased when the type of data is communicated in accordance with a wired protocol (e.g., DDR5, etc.). For instance, WI-FI data and/or BLU- ETOOTH data may be relatively error tolerant (e.g., having a BER<1E-6), gigabit passive optical network (GPON) data may be less error tolerant (e.g., having a BER<1E-10), and wired local area network (LAN) data, for instance, operating in accordance with TCP/IP protocol, may operate in a substantially error free manner (e.g., may reprocess any errors), among other possibilities. Stated differently, WI-FI data and/or BLUETOOTH data may permit a lower voltage to be employed due to the relatively high error tolerance of WI-FI data and/or BLUETOOTH data, as compared to other types of data such as GPON data, LAN data, etc. Alternatively, or in addition, a particular grade of an apparatus may have different reliability requirements such as a commercial grade apparatus have a different (e.g., higher reliability requirement) than a consumer grade apparatus.

As mentioned, a value of the altered supply voltage supplied by the second voltage regulator may be negatively correlated to a value of the error characteristic of data associated with the second voltage domain. As such, a value of the supply voltage may be altered to an altered supply voltage (with a different value than the second supply voltage) to selectively increase or decrease a value of the error characteristic. For example, at a first time (represented by 349-1), an increase in the error characteristic 344 can result from a decrease in the supply voltage 348. Thus, responsive to an increase in the error characteristic (e.g., an increase in BER), some embodiments may increase a supply voltage (e.g., such that a value of the altered supply voltage is greater than a value of the second supply voltage that was previously supplied by the second voltage regulator). The supply voltage increase may cause a decrease in the error characteristic. However, at a second time (represented by 349-T), a decrease in the error characteristic 344 can result from an increase in the supply voltage 348. Accordingly, the value of the error characteristic 344 can be maintained in the permissible error zone extending from an upper error value 343 to a lower error value 342.

Maintaining the value of the error characteristic 344 in the permissible error zone (e.g., permissible region) may yield a significant savings in power consumption by the data path in the second voltage domain and yet still ensure that a quantity of errors is maintained at an acceptable level (e.g., at which the apparatus may operate without or with error correction/detection mechanisms configured to detect/correct the quantity of errors). Though for clarity, during actual operation a quantity of an error characteristic may temporarily (e.g., for a short duration of time) exceed the upper error value 343 and/or may temporarily be below the lower error value 342 without departing from the scope of the present disclosure. Similarly, during actual operation a value of the supply voltage may temporarily exceed the upper supply voltage value and/or may temporarily be below the lower error value 342 without departing from the scope of the present disclosure.

In some embodiments, the lower error value 342 and the upper error value 343 may be larger than a value (e.g., a BER<1E-17) of an error characteristic associated with the first voltage domain. For instance, in some embodiments, upper error value 343 may be substantially equal to a maximum permissible number of errors and/or a maximum permissible error rate (e.g., BER<1E-3) that the error correction/detection circuitry of the second voltage domain are configured to operate at. For instance, the upper error value 343 may have a value that is less than the maximum permissible number of errors and/or the maximum permissible error rate that the error correction/detection circuitry but is still larger than a value of the error characteristic associated with the first voltage domain.

In some embodiments, the lower error value 342 may be a value that is less than the upper error value 343. For instance, lower error value 342 may be a value that is less than the upper error value and is larger than a value of the error characteristic associated with the first voltage domain. In some embodiments, the lower error value 342 can be one or more orders of magnitude less than a value of the upper error value 343. For instance, the upper error value 343 may be a given magnitude (e.g., a BER<1E-3) and the lower error value 342 may have a value (e.g., a BER<1E-4) that is less than the value of the upper error value 343, among other possibilities. Having the upper error value 343 be substantially equal to a maximum permissible number of errors and/or a maximum permissible error rate (e.g., BER<1E-3) at which the error correction/detection circuitry of the second voltage domain are configured to operate while also having the lower error value 342 be within an order of magnitude (e.g., a BER<1E-4) may yield a large reduction in the power consumption by the data path in the second voltage domain and yet still ensure that a quantity of errors associated with data in the second voltage domain (e.g., the data path) is maintained at an acceptable level.

Figure 4:
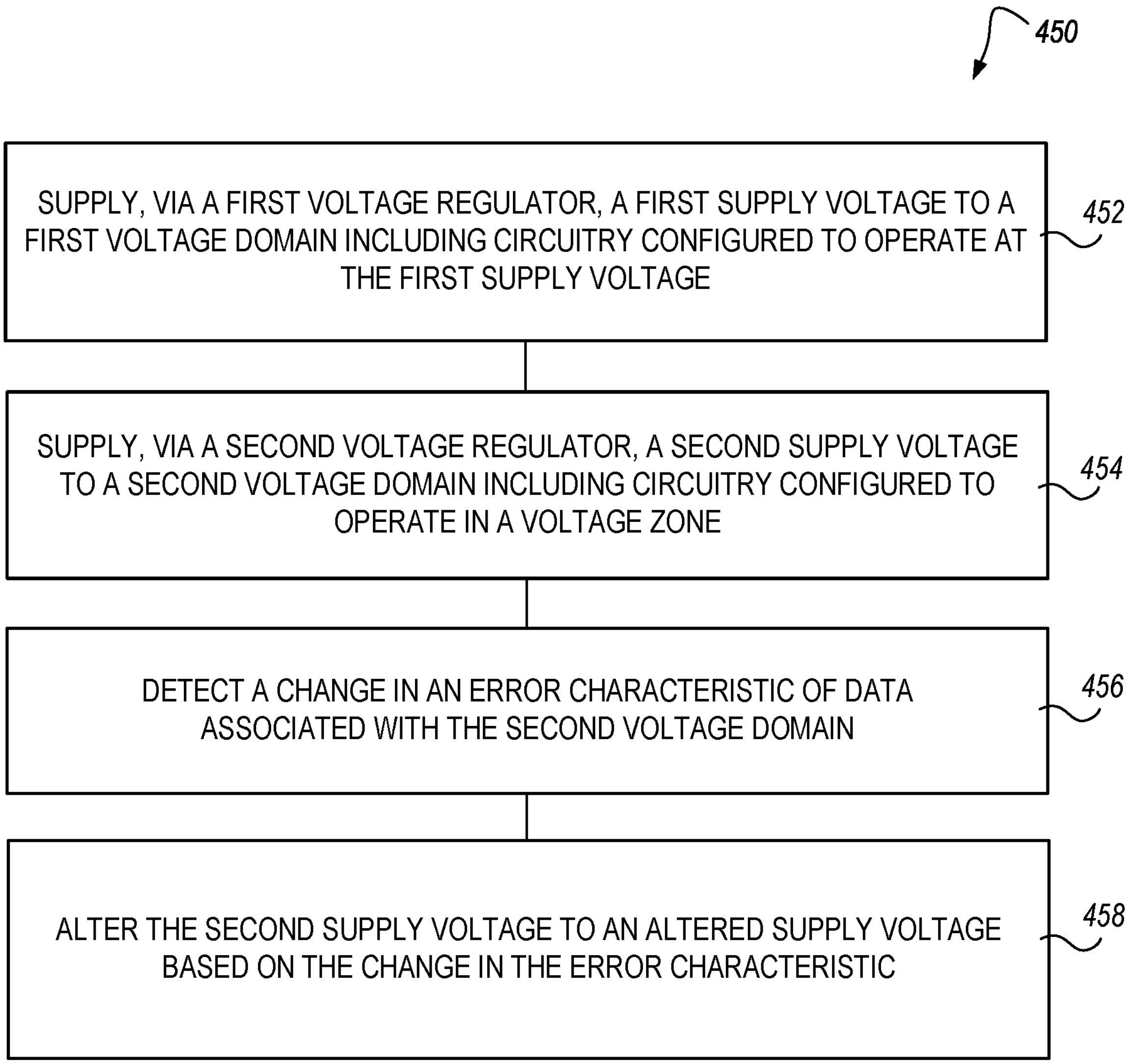
FIG. 4 is a flow diagram corresponding to a method for voltage domain based error management in accordance with some embodiments of the disclosure.

FIG. 4 is a flow diagram corresponding to a method 450 for voltage domain based error management in accordance with some embodiments of the disclosure. The method 450 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 450 is performed by the voltage management circuitry 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 452, the method 450 includes supplying, via a first voltage regulator, a first supply voltage to a first voltage domain including circuitry configured to operate at the first supply voltage. The first voltage regulator may be analogous to the first voltage regulator 221-1, while the circuitry can be analogous to the FF 229 and/or the logic 230 that are located in the first voltage domain illustrated in connection with FIGS. 2A and 2B.

At operation 454, the method 450 includes supplying, via a second voltage regulator, a second supply voltage to a second voltage domain including circuitry configured to operate in a voltage zone. In some embodiments, the first supply voltage may be higher than the second supply voltage, as described herein. For instance, the first supply voltage may be substantially equal to a nominal voltage (e.g., a nominal voltage of the first voltage regulator) and the second supply voltage substantially equal to a value that is less than the nominal voltage.

At operation 456, the method 450 includes detecting a change in an error characteristic of data associated with the second voltage domain. Detection of the change in the error characteristic of the data can be based on a quantity of errors detected and/or a quantity of error corrected, among other possibilities. For instance, the error characteristic may be a BER or raw-bit error rate of the data associated with the second voltage domain. For example, a BER of data associated with the second voltage domain (e.g., with the data path) may be determined based on the quantity of errors (e.g., uncorrectable and/or correctable errors) detected and/or a quantity of errors corrected over a period of time as is conventionally known.

At operation 458, the method 450 includes altering the second supply voltage to an altered supply voltage based on the change in the error characteristic (as determined at operation 456). In some embodiments, the second supply voltage and the altered supply voltage may each be included in the voltage zone, as described herein. As mentioned, a value of the altered supply voltage may be negatively correlated to the change in the error characteristic of the data. For instance, an increase in the error characteristic may result from (e.g., correspond to) a decrease in a supply voltage (e.g., when the value of the altered supply voltage is less than the second supply voltage). Stated differently, the altered supply voltage may be less than the second supply voltage to cause an increase in the error characteristic (and cause a resultant decrease in power consumption and ensure that the error characteristic does not go below the lower error value 342, as described in FIG. 3). Conversely, a decrease in the error characteristic may result from an increase in a supply voltage (e.g., when the value of the altered supply voltage is larger than a value than the second supply voltage). Stated differently, the altered supply voltage may be larger than the second supply voltage to cause a decrease in the error characteristic, for instance to ensure that the error characteristic is maintained within the permissible error zone (e.g., does not exceed the upper error value 343, as described in FIG. 3).

In some embodiments, the first supply voltage may remain substantially constant responsive to alteration of the second supply voltage to the altered supply voltage. For instance, the first supply voltage may remain substantially equal to a nominal voltage of the first voltage regulator before, during, and after alteration of the second supply voltage to the altered supply voltage. In this way, the control circuitry included in the first voltage domain may continue to operate in a substantially error-free manner even when the second supply voltage (supplied by the second voltage regulator) is altered to the altered supply voltage.

Figure 5:
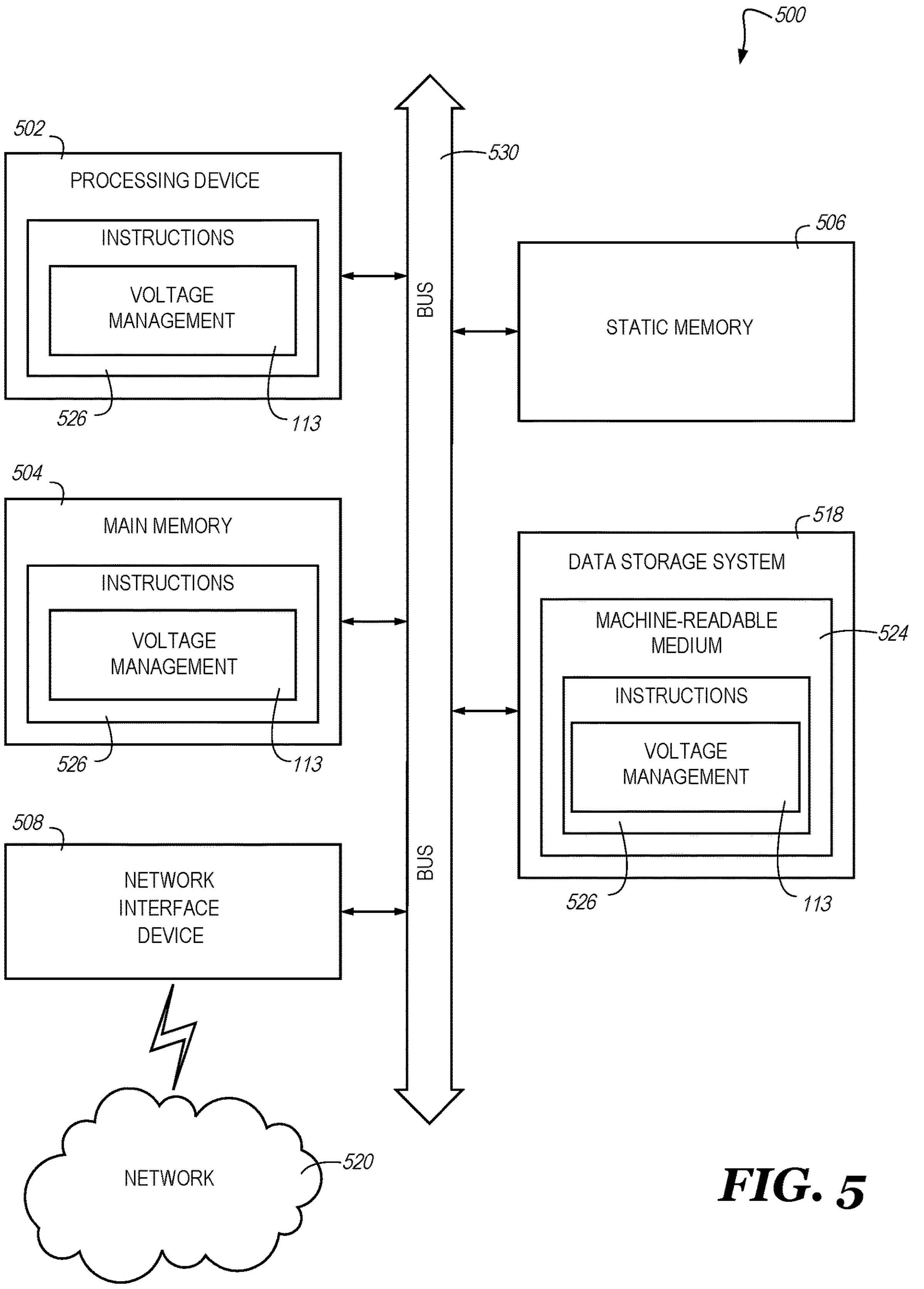
FIG. 5 is a block diagram of an example computer system that includes a memory device in accordance with some embodiments of the present disclosure.

FIG. 5 is a block diagram of an example computer system in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the voltage management circuitry 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to voltage management circuitry (e.g., the voltage management circuitry 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:

supplying, via a first voltage regulator, a first supply voltage to control path circuitry of a first voltage domain of a memory system, the first voltage domain configured to operate at the first supply voltage, wherein the control path circuitry is associated with a memory device of the memory system and the control path circuitry is configured to manage a data path associated with the memory device, wherein the data path is of a second voltage domain of the memory system;

supplying, via a second voltage regulator, a second supply voltage to data path circuitry of the second voltage domain configured to operate in a voltage zone, wherein the data path circuitry forms the data path and the data path is associated with the memory device;

detecting a change in an error characteristic of data associated with the second voltage domain; and altering the second supply voltage to an altered supply voltage based on the change in the error characteristic, wherein the second supply voltage and the altered supply voltage are different voltages included in the voltage zone.

2. The method of claim 1, wherein the error characteristic is a bit error rate (BER) of the data.

3. The method of claim 1, wherein a value of the altered supply voltage is negatively correlated to the change in the error characteristic of the data.

4. The method of claim 3, wherein:

the altered supply voltage is higher than the second supply voltage when the change in the error characteristic is a decrease in a value of the error characteristic; and the altered supply voltage is less than the second supply voltage when the change in the error characteristic is an increase in a value of the error characteristic.

5. The method of claim 1, wherein the first supply voltage is higher than the second supply voltage.

6. The method of claim 1, wherein the voltage zone is defined by an upper voltage and a lower voltage.

7. The method of claim 6, wherein the lower voltage, the upper voltage, or both, are variable.

8. The method of claim 7, wherein the lower voltage varies based on a type of the data, an operational temperature of the apparatus, an age of the apparatus, a variation in a nominal voltage of the voltage regulator, or any combination thereof.

9. An apparatus, comprising:

a memory device of a memory system;

a controller of the memory system coupled to the memory device, the memory device having a control path and data path associated therewith, wherein the control path is configured to manage the data path;

a first voltage regulator configured to provide a first supply voltage to control path circuitry of the control path associated with the memory device, the control path circuitry corresponding to a first voltage domain of the memory system;

a second voltage regulator configured to provide a second supply voltage to data path circuitry of the data path associated with the memory device, the data path circuitry corresponding to a second voltage domain of the memory system that is different than the first voltage domain, and wherein the data path circuitry is configured to operate in a voltage zone; and wherein the controller is configured to:

responsive to a change in an error characteristic of data associated with the data path, cause the second voltage regulator to supply an altered supply voltage to the data path circuitry, wherein a value of the altered supply voltage is negatively correlated to the change in the error characteristic of the data.

10. The apparatus of claim 9, wherein the first voltage regulator is coupled to a first voltage rail in the first voltage domain, and wherein the second voltage regulator is coupled to a second voltage rail in the second voltage domain.

11. The apparatus of claim 9, wherein the first supply voltage is equal to a nominal voltage of the first voltage regulator.

12. The apparatus of claim 9, further comprising at least one level shifter coupled to the first voltage domain and the second voltage domain.

13. A system, comprising:

a first voltage regulator;

a second voltage regulator;

control path circuitry of a first voltage domain of a memory device configured to operate at a first supply voltage, wherein the control path circuitry is associated with the memory device and the control path circuitry is configured to manage a data path of a second voltage domain of the memory device;

data path circuitry of the second voltage domain forming the data path and configured to operate in a voltage zone defined by an upper voltage and a lower voltage, wherein the data path is associated with the memory device; and a controller configured to:

cause the first voltage regulator to supply the first supply voltage to the first voltage domain;

cause the second voltage regulator to supply a second supply voltage that is less than the first supply voltage and is included in the voltage zone to the second voltage domain; and receive signaling indicative of a quantity of errors in data associated with the second voltage domain;

determine, based on the signaling indicative of the quantity of errors, a bit error rate (BER) of the data; and based on the BER, cause the second voltage regulator to alter the second supply voltage to an altered supply voltage that is supplied to the second voltage domain.

14. The system of claim 13, wherein the first supply voltage remains substantially constant responsive to alteration of the second supply voltage to the altered supply voltage.

15. The system of claim 13, wherein the errors include a quantity of correctable errors, and wherein the second voltage domain includes error correction circuitry configured to detect and correct the quantity of the correctable errors.

16. The system of claim 15, including a low-pass filter configured to:

attenuate the quantity of correctable errors when the quantity of correctable errors exceeds a correctable error threshold; and transmit to the controller signaling that is indicative of the quantity of correctable errors when the quantity of correctable errors is less than or equal to the correctable error threshold.

17. The system of claim 13, wherein the errors include a quantity of uncorrectable errors, and wherein the second voltage domain includes:

error detection circuitry configured to detect the quantity of the uncorrectable errors; and a counter to count the quantity of the uncorrectable errors.

18. The system of claim 17, further comprising a low-pass filter configured to:

attenuate the quantity of uncorrectable errors when the quantity of uncorrectable errors exceeds an uncorrectable error threshold; and transmit to the controller signaling indicative of the quantity of uncorrectable errors when the quantity of uncorrectable errors is less than or equal to the uncorrectable error threshold.

* * * * *